United States Patent
Lu et al.

(10) Patent No.: US 9,748,133 B2
(45) Date of Patent: Aug. 29, 2017

(54) VIA DEFINITION SCHEME

(71) Applicant: Taiwan Semiconductor Manufacturing Company, Ltd., Hsin-Chu (TW)

(72) Inventors: Yen-Cheng Lu, New Taipei (TW); Chih-Tsung Shih, Hsin-Chu (TW); Shinn-Sheng Yu, Hsin-Chu (TW); Jeng-Horng Chen, Hsin-Chu (TW); Anthony Yen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 5 days.

(21) Appl. No.: 15/217,623

(22) Filed: Jul. 22, 2016

(65) Prior Publication Data
US 2016/0329240 A1    Nov. 10, 2016

Related U.S. Application Data

(63) Continuation of application No. 14/024,103, filed on Sep. 11, 2013, now Pat. No. 9,412,647.

(51) Int. Cl.
| | |
|---|---|
| H01L 21/76 | (2006.01) |
| H01L 21/768 | (2006.01) |
| H01L 21/033 | (2006.01) |
| H01L 21/311 | (2006.01) |

(52) U.S. Cl.
CPC .... *H01L 21/76811* (2013.01); *H01L 21/0337* (2013.01); *H01L 21/31111* (2013.01); *H01L 21/31122* (2013.01); *H01L 21/31144* (2013.01); *H01L 21/76816* (2013.01); *H01L 2924/0002* (2013.01)

(58) Field of Classification Search
CPC . H01L 2924/01078; H01L 2924/01079; H01L 2924/01029; H01L 23/52; H01L 23/526; H01L 23/481
USPC .......................................................... 257/774
See application file for complete search history.

(56) References Cited

U.S. PATENT DOCUMENTS

| | | |
|---|---|---|
| 5,230,772 A | 7/1993 | Kadomura |
| 5,912,188 A | 6/1999 | Gardner et al. |
| 6,663,787 B1 | 12/2003 | You et al. |
| 6,836,017 B2 | 12/2004 | Ngo et al. |
| 7,906,252 B2 | 3/2011 | Lee et al. |
| 8,415,089 B1 | 4/2013 | Gupta et al. |
| 8,791,024 B1 | 7/2014 | Lu et al. |
| 2004/0097013 A1* | 5/2004 | Lur ............... H01L 21/7682 438/118 |

(Continued)

FOREIGN PATENT DOCUMENTS

| | | |
|---|---|---|
| CN | 102760688 A | 4/2011 |
| KR | 1020040005483 | 1/2004 |

(Continued)

*Primary Examiner* — Monica D Harrison
(74) *Attorney, Agent, or Firm* — Slater Matsil, LLP

(57) ABSTRACT

A method includes defining a metal pattern layer over a first dielectric layer. The first dielectric layer is disposed over an etch stop layer and the etch stop layer is disposed over a second dielectric layer. A spacer layer is grown over the metal pattern layer and the first dielectric layer. A metal trench is formed with a metal width in the first dielectric layer. A via hole is formed with a via width in the second dielectric layer.

20 Claims, 7 Drawing Sheets

(56) References Cited

U.S. PATENT DOCUMENTS

| | | |
|---|---|---|
| 2005/0170648 A1 | 8/2005 | Tsai et al. |
| 2006/0131756 A1 | 6/2006 | Bae |
| 2009/0219496 A1 | 9/2009 | Kamm et al. |
| 2010/0297851 A1 | 11/2010 | Bae et al. |
| 2011/0159253 A1 | 6/2011 | Kang et al. |

FOREIGN PATENT DOCUMENTS

| | | |
|---|---|---|
| KR | 1020040057579 | 7/2004 |
| KR | 1020060083507 | 7/2006 |
| KR | 1020110101098 | 9/2011 |
| TW | 200734812 | 9/2007 |

* cited by examiner

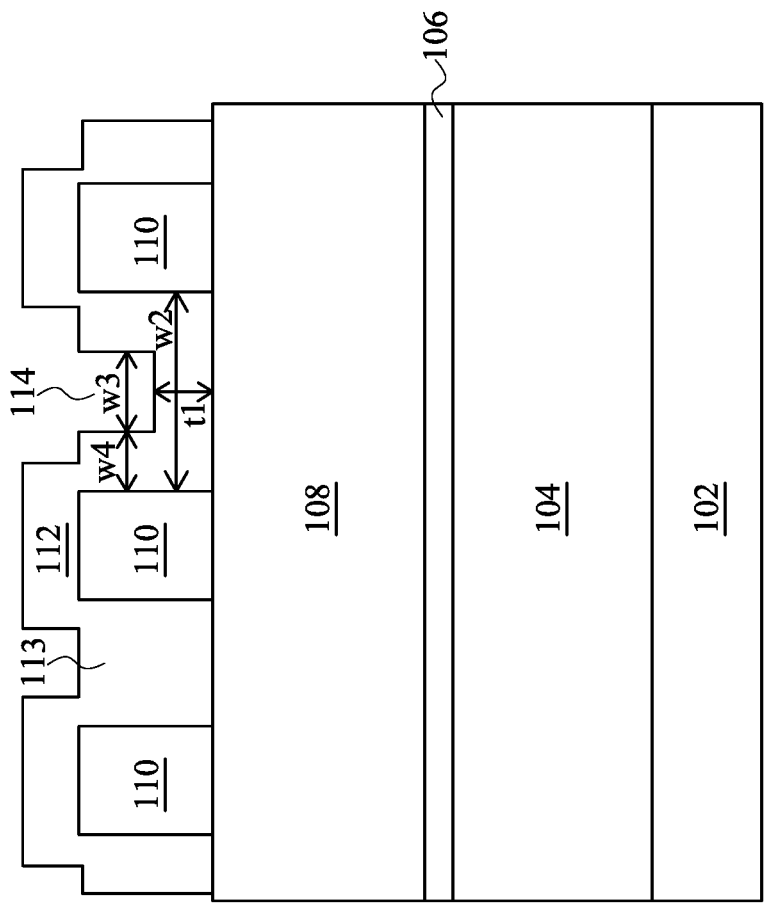
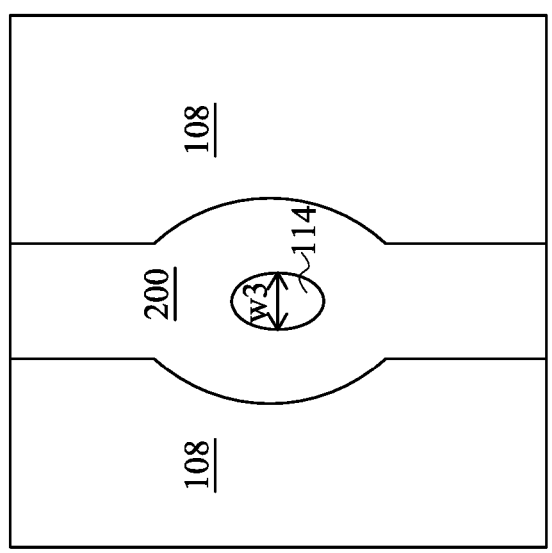
Fig. 2A
Fig. 2B

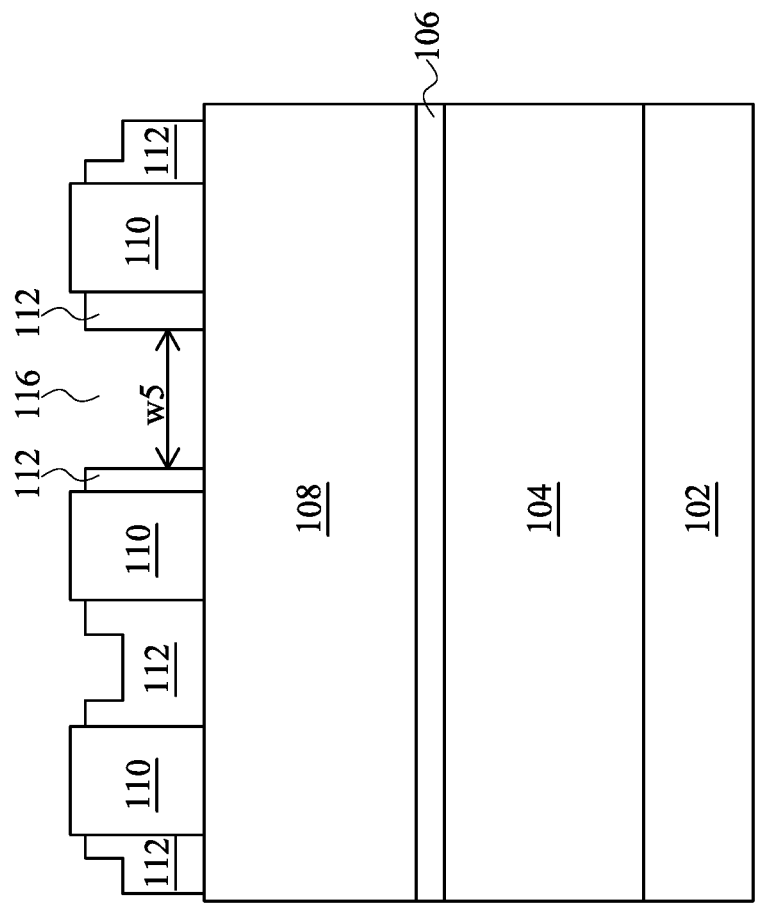
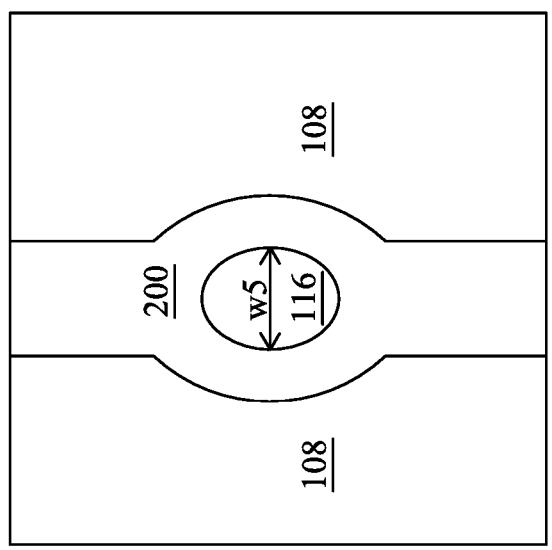
Fig. 3A
Fig. 3B

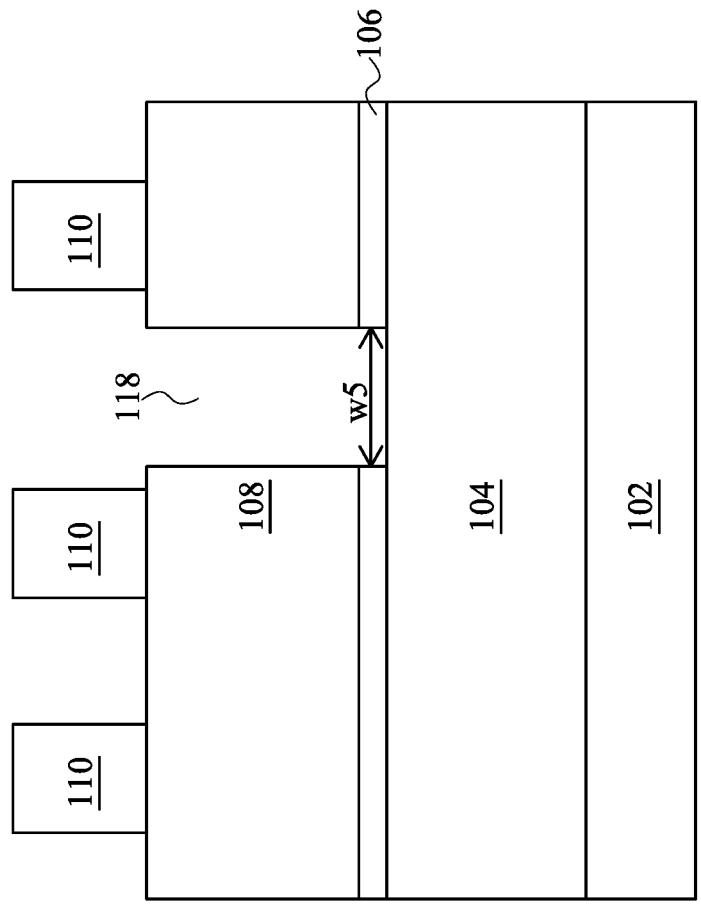
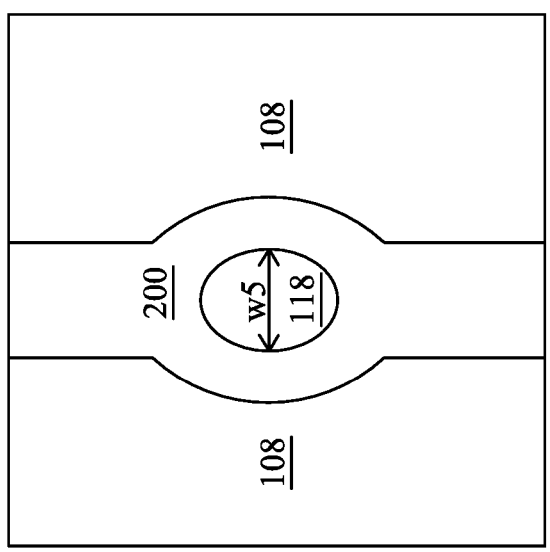
Fig. 5B
Fig. 5A

VIA DEFINITION SCHEME

This application is a continuation application of, and claims the benefit of, U.S. application Ser. No. 14/024,103, filed Sep. 11, 2013, entitled Via Definition Scheme, which application is incorporated herein in its entirety.

TECHNICAL FIELD

The present disclosure relates generally to an integrated circuit and more particularly to a via definition scheme.

BACKGROUND

In some fabrication process, two different masks are used to define metal lines and vias with two separate exposure processes. More efficient and cost effective methods to define the metal layer and via layer are desirable.

BRIEF DESCRIPTION OF THE DRAWINGS

Reference is now made to the following descriptions taken in conjunction with the accompanying drawings, in which:

FIG. 1A-FIG. 7 are top views of a layout or cross sections of an integrated circuit structure illustrating intermediate fabrication steps of an exemplary via definition scheme according to some embodiments.

DETAILED DESCRIPTION

Figure 1B:
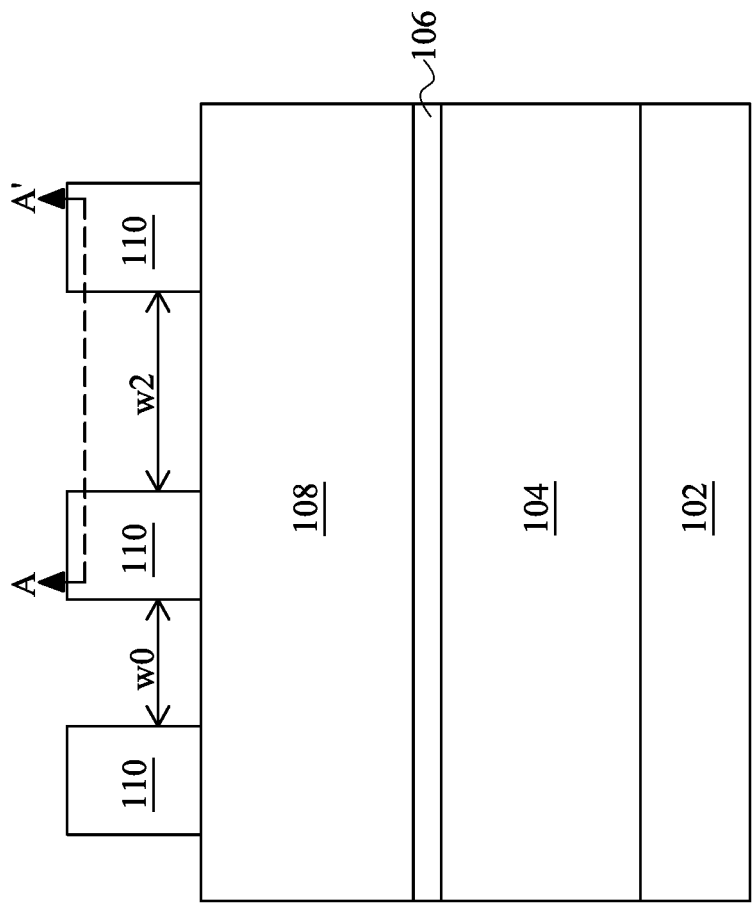

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A-FIG. 7 are top views of a layout or cross sections of an integrated circuit structure illustrating intermediate fabrication steps of an exemplary via definition scheme according to some embodiments.

Figure 1A:
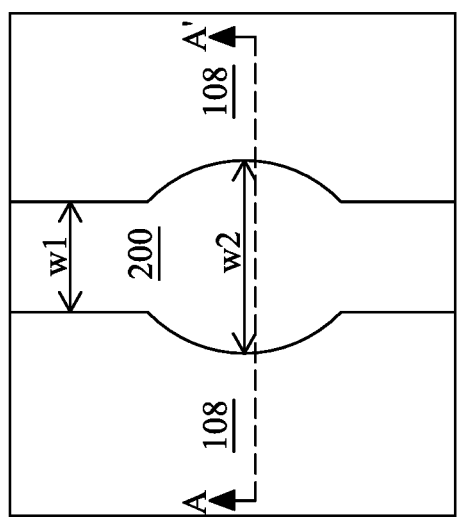

FIG. 1A is a top view of a layout of an exemplary via definition scheme according to some embodiments. In FIG. 1A, a metal line 200 and a dielectric layer 108 are shown in a layout. The metal line 200 has a width w1 in an area that does not have a via underneath and a width w2 in an area that has a via underneath. The w1 ranges from 40 nm to 50 nm and the w2 ranges from 60 nm to 70 nm in some embodiments. The w2 is greater than the w1 by 10%-50% in some embodiments. The metal line 200 has the w2 greater than the w1 in an oval or circular shape directly above the via.

FIG. 1B is a cross section of an integrated circuit structure of the exemplary via definition scheme in FIG. 1A according to some embodiments. FIG. 1B illustrates the cross section along the cutline A-A' in the layout of FIG. 1A, even though FIG. 1B is at a metal pattern definition stage using the metal pattern layer 110 and the metal line 200 in the layout of FIG. 1A is not formed yet. In FIG. 1B, a substrate 102, dielectric layers 104 and 108, an etch stop layer (or hard mask) 106, and a metal pattern layer 110 are shown.

The substrate 102 comprises silicon, silicon dioxide, aluminum oxide, sapphire, germanium, gallium arsenide (GaAs), an alloy of silicon and germanium, indium phosphide (InP), silicon on insulator (SOI), or any other suitable material. The substrate 102 may further include additional features or layers to form various devices and functional features.

The dielectric layers 104 and 108 comprise $SiO_2$ or any other suitable material with a thickness ranging from 30 nm to 100 nm, and can be formed over the substrate 102 and the etch stop layer 106 respectively by chemical vapor deposition (CVD) in some embodiments. The etch stop layer 106 (or hard mask) comprises TiN, SiO, SiC, SiN, SiOC, SiON, SiCN, $AlO_xN_y$, or any other suitable material with a thickness ranging from 2 nm to 10 nm, and can be formed over the dielectric layer 104 by CVD or a physical vapor deposition (PVD) in some embodiments.

The metal pattern layer 110 comprises photoresist or other material defined by photoresist. The metal pattern layer 110 is defined (patterned) by a single photolithography exposure. The metal pattern layer 110 has a thickness ranging from 70 nm to 100 nm in some embodiments. The metal pattern layer 110 between the cutline A-A' has a spacing w2 that is the same as the metal line 200 width w2 in FIG. 1A. The w2 ranges from 60 nm to 70 nm in some embodiments.

FIG. 2A is the top view of the layout in FIG. 1A with an open region 114 having a width w3 according to some embodiments. FIG. 2B is the cross section of the integrated circuit structure in FIG. 1B after the spacer layer 112 is grown according to some embodiments. The spacer layer 112 comprises SiN or any other suitable material and has a thickness ranging from 20 nm to 30 nm in some embodiments. The spacer layer 112 comprising SiN has a different etching characteristics from dielectric layers 104 and 106 comprising $SiO_2$, for example, thus enabling a selective etching in some embodiments. The spacer layer 112 is grown by atomic layer deposition (ALD) in some embodiments.

The shape of the spacer layer 112 is conformal to the metal pattern layer 110. The spacer layer 112 has a width w4 and a thickness t1 ranging from 20 nm to 30 nm. An area 113 that has a planned metal trench 121 in FIG. 7 but does not have a planned via underneath is filled (or sealed) by the spacer layer 112. On the other hand, another area that has a planned via underneath has the open region 114 formed on the top of the planned via (to be formed in the via hole 120 in FIG. 7), resulting from the metal pattern layer 110 spacing of w2.

FIG. 3A is the top view of the layout in FIG. 1A with an open region 116 having a width w5 according to some embodiments. FIG. 3B is the cross section of the integrated circuit structure in FIG. 2B after the spacer layer 112 is etched to form the opening 116 that has a spacing w5 that matches the via width to be formed in the via hole 120 in FIG. 7 according to some embodiments.

A wet etching process can be used for this step. For example, the spacer layer 112 can be etched by hot $H_3PO_4$ (with the temperature ranging from 80° C. to 200° C.) to be removed from the top of the planned via region and to extend the open region 114 in FIG. 2B to match the planned via width. The width w5 ranges from 30 nm to 50 nm in some embodiments. This step is optional since the width w3 of the open region 114 in FIG. 2B may be suitable for the planned via width in some other embodiments.

Figure 4A:
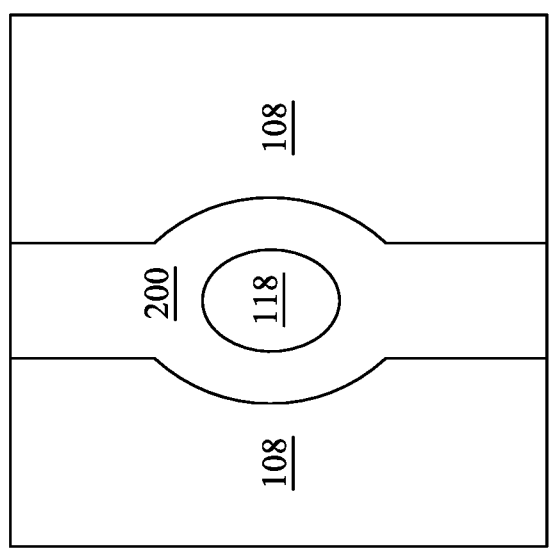
Figure 4B:
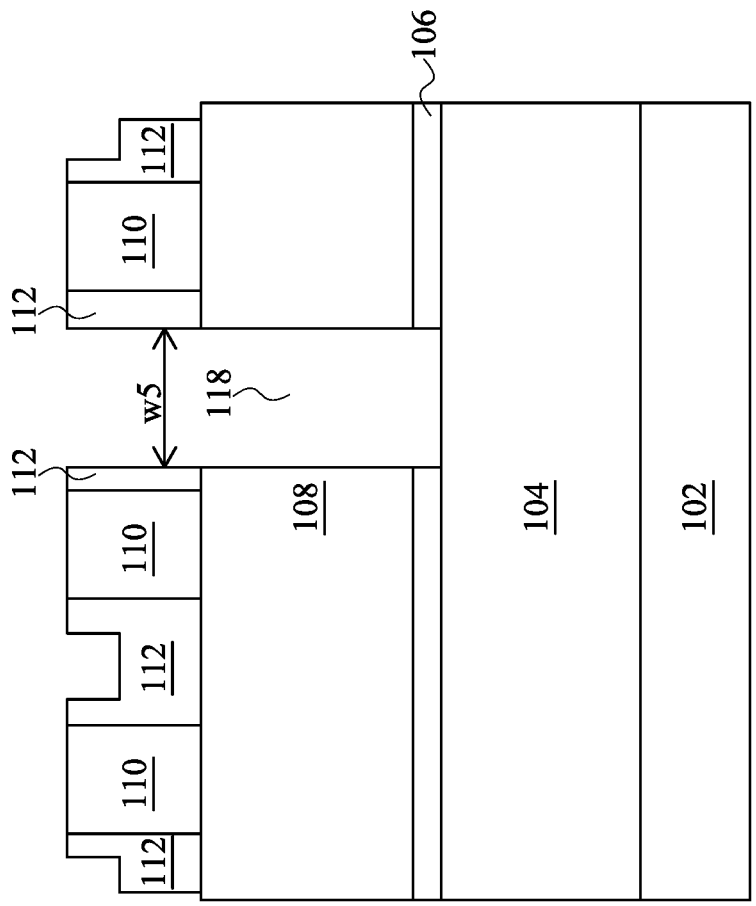

FIG. 4A is the top view of the layout in FIG. 1A with an open region 118 according to some embodiments. FIG. 4B is the cross section of the integrated circuit structure in FIG. 3B after the dielectric layer 108 is etched to form the opening 118 that has a spacing w5 that matches the via width to be formed in the via hole 120 in FIG. 7 according to some embodiments. A dry etching process can be used for this step. For example, $C_2F_6$ or $CF_4$ can be used to dry etch the dielectric layer 108 comprising $SiO_2$, and $Cl_2$ can be used to dry etch the etch stop layer (or hard mask) 106 comprising TiN.

FIG. 5A is the top view of the layout in FIG. 1A with an open region 118 according to some embodiments. FIG. 5B is the cross section of the integrated circuit structure in FIG. 4B after the spacer layer 112 is removed according to some embodiments. A wet etching process can be used for this step. For example, the spacer layer 112 can be removed by hot $H_3PO_4$ with the temperature ranging from 80° C. to 200° C.

Figure 6B:
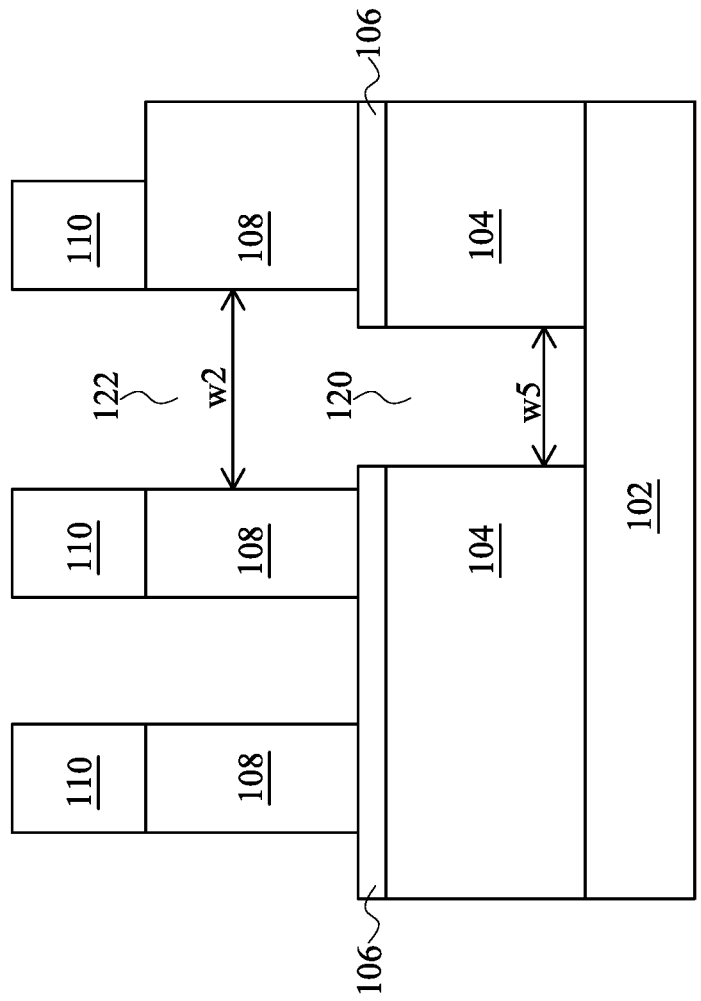
Figure 6A:
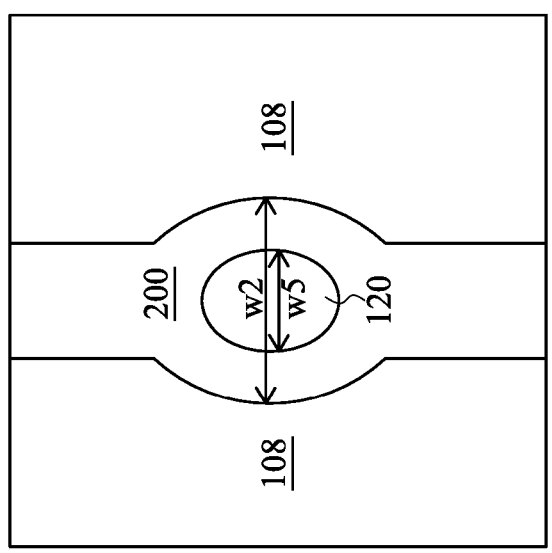

FIG. 6A is the top view of the layout in FIG. 1A with the via hole 120 according to some embodiments. FIG. 6B is the cross section of the integrated circuit structure in FIG. 5B after the dielectric layers 104 and 108 are etched to form the metal trench 122 and the via hole 120 according to some embodiments. A dry etching process can be used for this step. For example, $C_2F_6$ or $CF_4$ can be used to dry etch dielectric layers 104 and 108 comprising $SiO_2$.

Figure 7:
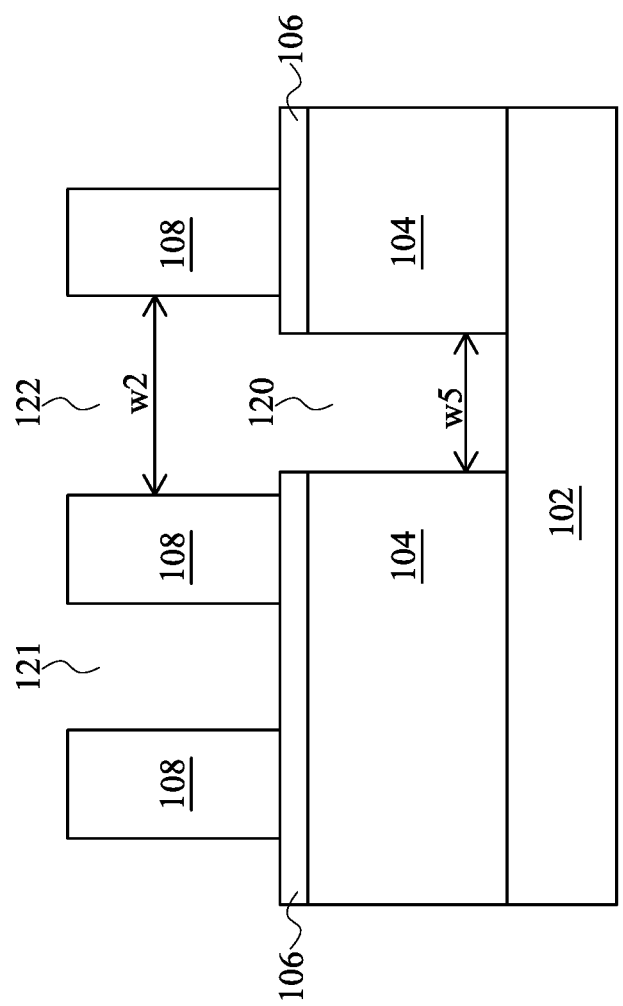

FIG. 7 is the cross section of the integrated circuit structure in FIG. 6B after the metal pattern layer 110 is removed according to some embodiments. The metal pattern layer 110 comprising photoresist can be removed by an $O_2$ ash process, for example.

Afterwards, the metal trench 122 and the via hole 120 can be filled with metal to form a metal line and a via, respectively. For example, Cu can be deposited using an electrochemical plating process. In some embodiments, a Cu seed layer is formed by PVD with a thickness ranging from 2 nm to 10 nm in the metal trench 122 and the via hole 120 prior to filling the metal trench 122 and the via hole 120. In some embodiments, a polishing process such as a chemical mechanical polishing is performed after filling the metal trench 122 and the via hole 120 to remove excess material (e.g., a top part of the metal filled over the metal trench 122).

By using the method described above, a via can be defined by the use of the metal pattern layer 110 according to the metal trench shape (e.g., width). This method completes the via definition by a single photolithography exposure of the metal pattern layer 110 and using the spacer layer 112, compared to two exposures for a conventional dual damascene process. Thus, two mask patterns used for the conventional process can be reduced to one mask, which reduces cost and topography impact from multiple exposures.

According to some embodiments, a method includes defining a metal pattern layer over a first dielectric layer. The first dielectric layer is disposed over an etch stop layer and the etch stop layer is disposed over a second dielectric layer. A spacer layer is grown over the metal pattern layer and the first dielectric layer. A metal trench is formed with a metal width in the first dielectric layer. A via hole is formed with a via width in the second dielectric layer.

According to some embodiments, an integrated circuit includes a via having a via width in a via layer. A metal line in a metal layer is disposed over the via layer. The metal line has a first width for a first area that is not directly above the via and a second width for a second area that is directly above the via. The second width is greater than the first width.

In an embodiment a method is provided. The method includes defining a conductive line pattern layer over a first dielectric layer, wherein the first dielectric layer is disposed over a second dielectric layer, and wherein an opening in the conductive line pattern layer exposes a first portion of the first dielectric layer, the first portion having a first width and forming spacers along sidewalls of the opening, wherein after forming the spacers a second portion of the first dielectric layer is exposed, the second portion of the first dielectric layer having a second width. The method further includes etching the second portion of the first dielectric layer using the spacers as a mask to expose a portion of the second dielectric layer, removing the spacers after etching the second portion of the first dielectric layer, the removing exposing third portions of the first dielectric layer, etching the third portions of the first dielectric layer to form a trench in the first dielectric layer, the trench having the first width, and etching the portion of the second dielectric layer to form a via hole in the second dielectric layer, the via hole having the second width.

In another embodiment, an integrated circuit is provided. The integrated circuit includes a metal line in a dielectric layer, the metal line having a linear portion and an enlarged area in a plan view, and a via extending from the metal line through an underlying dielectric layer, the via being completely below the enlarged area in the plan view.

In another embodiment, an integrated circuit is provided. The integrated circuit includes one or more dielectric layers, a metal line extending from a top of the one or more dielectric layers, and a via extending from the metal line to a bottom of the one or more dielectric layers, wherein a first portion of the metal line directly overlying the via has a width greater than a second portion of the metal line not directly overlying the via.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
defining a conductive line pattern layer over a first dielectric layer, wherein the first dielectric layer is disposed over a second dielectric layer, and wherein an opening in the conductive line pattern layer exposes a first portion of the first dielectric layer, the first portion having a first width;
forming spacers along sidewalls of the opening, wherein after forming the spacers a second portion of the first dielectric layer is exposed, the second portion of the first dielectric layer having a second width;
etching the second portion of the first dielectric layer using the spacers as a mask to expose a portion of the second dielectric layer;
removing the spacers after etching the second portion of the first dielectric layer, the removing exposing third portions of the first dielectric layer;
etching the third portions of the first dielectric layer to form a trench in the first dielectric layer, the trench having the first width; and
etching the portion of the second dielectric layer to form a via hole in the second dielectric layer, the via hole having the second width.

2. The method of claim 1, wherein forming the spacers comprises forming a spacer layer over the conductive line pattern layer and etching to remove portions of the spacer layer along a bottom of the opening, thereby forming the spacers.

3. The method of claim 2, wherein the conductive line pattern layer comprises an enlarged area and a narrow area, wherein the first portion corresponds to the enlarged area, and wherein the spacer layer fills the narrow area while etching the second portion.

4. The method of claim 2, wherein the spacer layer is grown by an atomic layer deposition (ALD) process.

5. The method of claim 1, wherein the first width is greater than the second width by 10%-50%.

6. The method of claim 1, wherein the second dielectric layer comprises an etch stop layer, and wherein etching the portion of the second dielectric layer comprises etching a third dielectric layer, the etch stop layer being on the third dielectric layer.

7. The method of claim 1, wherein the spacers comprise SiN.

8. An integrated circuit, comprising:
a metal line in a dielectric layer, an upper surface of the metal line being level with an upper surface of the dielectric layer, the upper surface of the metal line having a linear portion and an enlarged area in a plan view, the linear portion of the upper surface of the metal line having a first width along a first direction in the plan view, the enlarged area of the upper surface of the metal line having a second width along a second direction in the plan view, the first direction and the second direction being parallel in the plan view; and
a conductive via extending from the metal line through an underlying dielectric layer, the conductive via being completely below the enlarged area in the plan view.

9. The integrated circuit of claim 8, wherein a width of the enlarged area is 10-50% greater than a width of the linear portion.

10. The integrated circuit of claim 8, wherein a width of the linear portion of the metal line is greater than a width of the conductive via.

11. The integrated circuit of claim 8, wherein the metal line extends through a first dielectric layer and the conductive via extends through a second dielectric layer different than the first dielectric layer.

12. The integrated circuit of claim 11, further comprising an etch stop layer interposed between the first dielectric layer and the second dielectric layer.

13. The integrated circuit of claim 8, wherein the enlarged area has an oval shape.

14. The integrated circuit of claim 8, wherein the enlarged area has a circular shape.

15. An integrated circuit comprising:
one or more dielectric layers;
a metal line extending from a top of the one or more dielectric layers; and
a conductive via extending from the metal line to a bottom of the one or more dielectric layers, wherein a first portion of the metal line directly overlying the conductive via has a width greater than a second portion of the metal line not directly overlying the conductive via, an upper surface of the first portion being level with an upper surface of the second portion, the first portion extending a full width of the metal line, the second portion extending a full with of the metal line.

16. The integrated circuit of claim 15, wherein the one or more dielectric layers comprise:
a first dielectric layer;
an etch stop layer on the first dielectric layer; and
a second dielectric layer on the etch stop layer.

17. The integrated circuit of claim 16, wherein the metal line extends through the first dielectric layer, and wherein the conductive via extends through the etch stop layer and the second dielectric layer.

18. The integrated circuit of claim 15, the width of the first portion is 10%-50% greater than a width of the second portion.

19. The integrated circuit of claim 15, wherein the first portion has an oval shape.

20. The integrated circuit of claim 15, wherein the first portion has a circular shape.

* * * * *